(12) United States Patent
Renard et al.

(10) Patent No.: US 10,263,081 B2
(45) Date of Patent: Apr. 16, 2019

(54) METHOD FOR MAKING AN ELECTRICAL CONTACT ON A GRAPHITE LAYER, CONTACT OBTAINED BY USING SUCH A METHOD AND ELECTRONIC DEVICE USING SUCH A CONTACT

(71) Applicant: COMMISSARIAT A L'ENERGIE ATOMIQUE ET AUX ENERGIES ALTERNATIVES, Paris (FR)

(72) Inventors: Vincent Renard, La Buisse (FR); Toai Le Quang, Grenoble (FR); Claude Chapelier, Domene (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/730,147

(22) Filed: Oct. 11, 2017

(65) Prior Publication Data
US 2018/0108740 A1    Apr. 19, 2018

(30) Foreign Application Priority Data

Oct. 13, 2016  (FR) ...................................... 16 59890

(51) Int. Cl.
*H01L 29/16* (2006.01)
*H01L 21/02* (2006.01)
(Continued)

(52) U.S. Cl.
CPC .... *H01L 29/1606* (2013.01); *H01L 21/02378* (2013.01); *H01L 21/02612* (2013.01); *H01L 29/45* (2013.01); *H01L 29/66015* (2013.01)

(58) Field of Classification Search
CPC ................ H01B 1/04; H01L 21/02378; H01L 21/02612; H01L 29/1606; H01L 29/45; H01L 2924/0002; H01L 29/66015
See application file for complete search history.

(56) References Cited

U.S. PATENT DOCUMENTS

2014/0051241 A1  2/2014 Kinoshita et al.
2014/0175458 A1  6/2014 Ahn et al.
(Continued)

OTHER PUBLICATIONS

Search Report as issued in French Patent Application No. 1659890, dated Jun. 21, 2017.
(Continued)

*Primary Examiner* — Caridad Everhart
(74) *Attorney, Agent, or Firm* — Pillsbury Winthrop Shaw Pittman LLP

(57) ABSTRACT

A method for manufacturing a graphite layer on an interstitial carbide layer, includes depositing a metal layer formed by one or more metals on a carbide substrate, the metal layer being able to form an interstitial carbide, the metal layer at least partially covering the carbide substrate; performing a heat treatment during which a temperature higher than the dissociation temperature of the carbide of the carbide substrate is applied; wherein the heat allows a reaction between the metal layer and the carbide substrate to form the interstitial carbide layer as well as a first part of the graphite layer at the surface of the interstitial carbide layer, and, when the metal layer only partially covers the carbide substrate, a formation of a second part of the graphite layer at the surface of the carbide substrate which is not covered with the metal layer.

9 Claims, 7 Drawing Sheets

(51) Int. Cl.
    *H01L 29/45*       (2006.01)
    *H01L 29/66*       (2006.01)

(56) References Cited

U.S. PATENT DOCUMENTS

| | | | |
|---|---|---|---|
| 2016/0009560 A1* | 1/2016 | Kaya | B82Y 30/00 428/141 |
| 2016/0130519 A1* | 5/2016 | Zhao | C10M 111/06 508/109 |
| 2016/0146350 A1* | 5/2016 | Zhao | F16J 15/102 277/312 |
| 2017/0321069 A1* | 11/2017 | Zhao | C09D 7/61 |

OTHER PUBLICATIONS

Allain, A., et al., Electrical contacts to two-dimensional semiconductors, Nature Materials, vol. 14, No. 12, XP55354723, Nov. 2015, pp. 1195-1205.

Park, H.-Y., et al., "Extremely Low Contact Resistance on Graphene through n-Type Doping and Edge Contact Design," Advanced Materials, vol. 28, 2016, pp. 864-870.

* cited by examiner

METHOD FOR MAKING AN ELECTRICAL CONTACT ON A GRAPHITE LAYER, CONTACT OBTAINED BY USING SUCH A METHOD AND ELECTRONIC DEVICE USING SUCH A CONTACT

CROSS-REFERENCE TO RELATED APPLICATION

This application claims priority to French Patent Application No. 1659890, filed Oct. 13, 2016, the entire content of which is incorporated herein by reference in its entirety.

TECHNICAL FIELD OF THE INVENTION

The technical field of the invention is that of electronics. The present invention relates to a method for making an electrical contact and in particular a method for making an electrical contact on graphite deposited onto a carbide substrate. The present invention also relates to a method for making a graphite based electronic device. The invention further relates to an electrical contact or an electronic device capable of being obtained by said methods.

TECHNOLOGICAL BACKGROUND OF THE INVENTION

Graphite, for example as one or more graphene sheets, is today an element led to play an essential role in the field of microelectronics or also spintronics. In order to obtain a good quality graphite layer, several techniques have been contemplated. It is in particular known to produce a graphite layer from a silicon carbide substrate. For this, it is necessary to heat the substrate at a temperature higher than the dissociation temperature of the silicon carbide. Indeed, during such a heat treatment, a graphite layer is formed at the surface of said substrate, the thickness of this layer depending on the duration of the heat treatment and the temperature applied to the substrate. It has also been shown that it was possible to resort to such a method with an aluminium carbide substrate with higher treatment temperatures. On the other hand, to date, there is no technique enabling, using, a heat treatment, graphite to be made on a so-called interstitial carbide layer, that is a carbide for which the carbon atoms are inserted in the interstices between metal atoms such as Titanium (Ti), Zirconium (Zr), Hafnium (Hf), Vanadium (V), Niobium (Nb), Tantalum (Ta), Chromium (Cr), Molybden (Mo) or Tungsten (W). Further, the dissociation temperature of such a carbide is very high, therefore a similar method would thus imply the use of very high temperatures, which raises problems in terms of manufacture and energy cost.

The issue of obtaining a good quality graphite layer is not the only difficulty encountered in manufacturing graphite based devices. It is also difficult to make electrical contacts enabling a graphite layer to be electrically connected. In order to define such contacts, it is known to deposit a metal layer at the surface of the graphite layer to be contacted and then to structure the metal layer in order to form one or more contacts. But, although an electrical connection is established by this technique, the latter is very often of a poor quality. In other words, a high electrical resistance exists between the metal layer forming the contact and the graphite layer desired to be contacted. In order to improve the quality of these contacts, it is therefore known to perform surface treatments as for example described in H. Y Park and Al's article, Adv. Mater. 28, 864 (2016), which imposes further method steps which are often complex. Moreover, as previously discussed, it is also necessary to structure the metal layer in order to form the different connections. These different requirements raise difficulties both in terms of cost and in terms of industrialization, since the methods used are very difficult to transpose in an industrial production environment.

There is thus a need for a method enabling a graphite layer to be obtained on an interstitial carbide layer by heat treatment. There is also a need for a method enabling a graphite layer to be contacted which does not require a complex and expensive surface treatment operation.

SUMMARY OF THE INVENTION

The invention provides a solution to the aforementioned discussed problems, by enabling a graphite layer to be obtained on an interstitial carbide layer by a heat treatment involving a stack including a carbide substrate and a metal layer able to form an interstitial carbide layer. The method further provides the possibility of obtaining a contact having a low resistance between an interstitial carbide and a graphite layer. Such a contact can thus be used thereafter in order to manufacture a graphite based electronic device.

For this, a first aspect of the invention relates to a method for manufacturing a graphite layer on an interstitial carbide layer comprising:
  a step of depositing a metal layer formed by one or more metals on a carbide substrate, the metal layer being able to form an interstitial carbide, said metal layer at least partially covering the carbide substrate;
  a heat treatment step during which a temperature higher than the dissociation temperature of the carbide of the substrate is applied.

The heat treatment step allows the reaction between the metal layer and the carbide substrate so as to form an interstitial carbide layer as well as a first part of a graphite layer at the surface of said interstitial carbide layer. It also allows the formation, when the metal layer only partially covers the carbide substrate, of a second part of the graphite layer on the part of the carbide substrate which is not covered by the metal layer. By "the layer being able to form an interstitial carbide", it is meant that the material making up the layer has a preferential affinity for carbon. In other words, the temperature and pressure conditions upon implementing the method according to the invention are chosen such that the affinity of the material making up the metal layer with carbon is higher than the affinity of said material with the other chemical elements making up the carbide substrate.

Thus, it is possible to form a graphite layer on an interstitial carbide layer without having to apply, during the heat treatment step, a temperature higher than the dissociation temperature of the interstitial carbide. Indeed, the only requirement as regards temperature during the heat treatment step is that the temperature applied must be higher than the dissociation temperature of the carbide of the substrate. By dissociation temperature of a compound, here carbide, it is meant the temperature from which the metal atoms dissociate from the carbide and the carbon atoms reorganise to form another carbon material. This temperature depends on the pressure and gas used. Moreover, by graphite layer, it is meant a layer comprising one or more graphene sheets.

Moreover, the inventors have noticed that the resistance at the interface between the graphite layer and the interstitial carbide layer which are obtained at the end of the heat treatment step is very low. In other words, the above method can be used not only to obtain a graphite layer on an interstitial carbide layer at a lower temperature than the dissociation temperature of said interstitial carbide but also to provide an electrical contact of interstitial carbide having a low contact resistance with the graphite layer.

For this, a second aspect of the invention relates to a method for making an electrical contact on a graphite layer deposited onto a carbide substrate including:
- a step of depositing a metal layer formed by one or more metals onto a carbide substrate, the metal layer being able to form an interstitial carbide, said metal layer at least partially covering the carbide substrate;
- a step of structuring said metal layer, said structuring defining a first metal contact and a second metal contact;
- a heat treatment step during which a temperature higher than the dissociation temperature of the carbide of the substrate is applied.

As previously explained, the heat treatment step allows on the one hand the reaction between the metal contact and the substrate to form an interstitial carbide contact as well as a first part of a graphite layer at the surface of said contact; and on the other hand the formation of a second part of the graphite layer at the surface of the substrate which is not covered with the contact.

Thus, an interstitial carbide contact is obtained which, in view of the low resistance at the interface between the graphite layer and the interstitial carbide layer making up the contact, has a low contact resistance. Further, as previously detailed, the graphite layer grows not only at the interstitial carbide contact but also at the part of the carbide substrate which is not covered with said contact. The contact obtained by the method according to a second aspect of the invention thus allows an electrical contact to be obtained on a graphite layer deposited onto a carbide substrate. The expression "an electrical contact on a graphite layer", should not be understood herein as the location of the contact but means that the electrical connection is made between the electrical contact and the graphite layer. Such an electrical contact can then be used in order to manufacture a graphite based electronic device.

For this, a third aspect of the invention relates to a method for making a graphite based electronic device comprising:
- a step of depositing a metal layer formed by one or more metals onto a carbide substrate, the metal layer being able to form an interstitial carbide, said metal layer at least partially covering the carbide substrate;
- a first step of structuring said metal layer, said structuring defining a first metal contact and a second metal contact;
- a heat treatment step during which a temperature higher than the dissociation temperature of the carbide of the substrate is applied.

As previously explained, during this heat treatment step, the first and second metal contacts react with the carbide substrate to form a first and a second interstitial carbide contacts as well as a first part of a graphite layer at the surface of said contacts. Moreover, a second part of the graphite layer is formed at the surface of the substrate which is not covered by the first and second contacts.

The method according to a third aspect of the invention also comprises a second step of structuring the graphite layer present at the surface of the first contact, the second contact and the non-covered part of the carbide substrate defining an active part connecting the first contact to the second contact.

Thus, an electronic device is obtained comprising two electrical contacts connected to each other by a graphite layer deposited onto a carbide substrate. The advantage of this device is to provide two proper electrical contacts with the graphite layer deposited onto the carbide substrate.

A fourth aspect of the invention relates to an electrical contact capable of being obtained using a manufacturing method according to a second aspect of the invention.

A fifth aspect of the invention relates to an electronic device capable of being obtained using a manufacturing method according to a third aspect of the invention.

Beside the characteristics just discussed in the preceding paragraph, the method according to a first aspect of the invention, a second aspect of the invention or a third aspect of the invention can have one or more complementary characteristics among following ones, considered singly or according to any technically possible combinations.

Advantageously, the graphite layer is comprised of a graphene sheet.

Advantageously, the carbide of the substrate is a less conductive carbide, at the operating temperature of the contact, than the graphite of the graphite layer. In other words, the resistivity of the carbide of the substrate is higher than the resistivity of the graphite of the graphite layer, the resistivity being that measured at the operating temperature of the contact according to a second aspect of the invention or of the device according to a third aspect of the invention. Thus, it is ensured that the device is not short-circuited by the substrate.

Advantageously, the carbide of the substrate is an insulating carbide. By "insulating carbide", it is meant a carbide the resistivity of which is higher than 100 times, preferentially 500 times, or even 1 000 times the resistivity of the graphite layer. The resistivity considered is the resistivity measured at the operating temperature of the graphite layer of the contact or of the device obtained using a method according to a second aspect or a third aspect of the invention.

Advantageously, the substrate is a silicon carbide substrate or an aluminium carbide substrate.

Advantageously, the metal(s) forming the metal layer are chosen from Titanium (Ti), Zirconium (Zr), Hafnium (Hf), Vanadium (V), Niobium (Nb), Tantalum (Ta), Chromium (Cr), Molybdenum (Mo), Tungsten (W) or alloys thereof. Thus, it is possible to obtain hybrid structures, for example semi-conducting/superconducting, semi-conducting/ferromagnetic structures, etc.

The invention and its different applications will be better understood upon reading the description that follows and upon examining the accompanying figures.

BRIEF DESCRIPTION OF THE FIGURES

The figures are given by way of indicating and in no way limiting the invention.

DETAILED DESCRIPTION OF AT LEAST ONE EMBODIMENT OF THE INVENTION

Figure 1A:
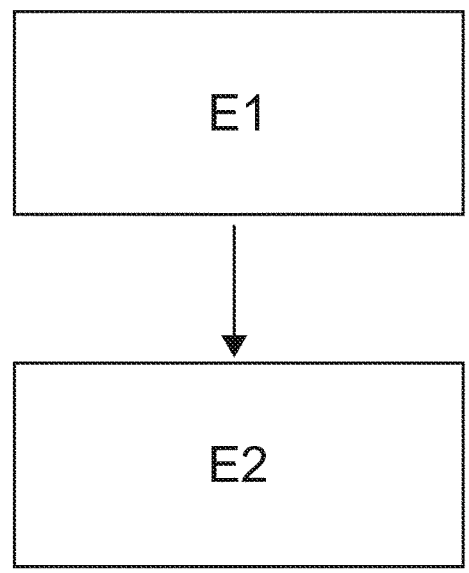
FIG. 1A shows a flowchart of a first embodiment of a method according to a first aspect of the invention.

Unless otherwise set out, a same element appearing in different figures has a single reference numeral.

Figure 1B:
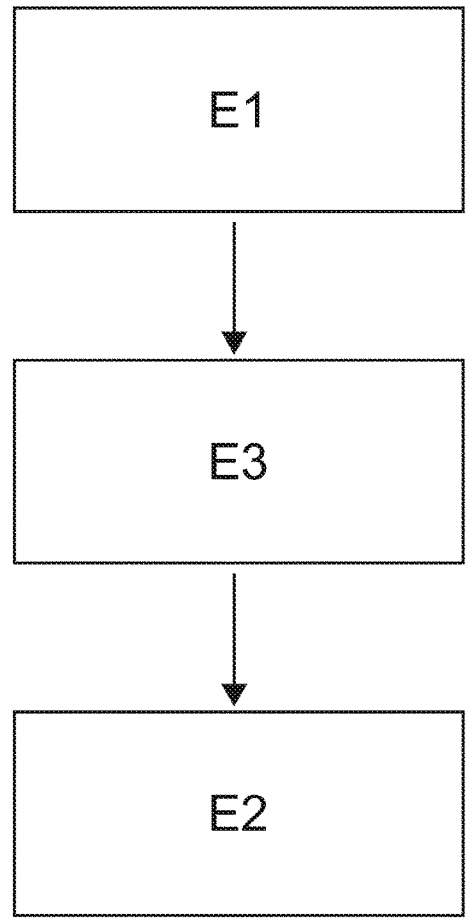
FIG. 1B shows a flowchart of a second embodiment of a method according to a first aspect of the invention.
Figure 2A:
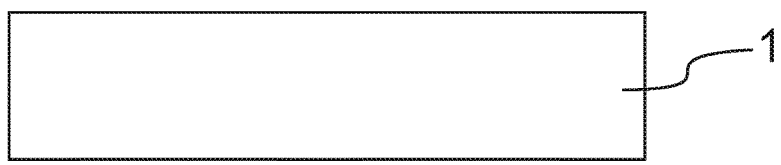
FIGS. 2A to 2C illustrate the different steps of a first embodiment of a method according to a first aspect of the invention.
Figure 2B:
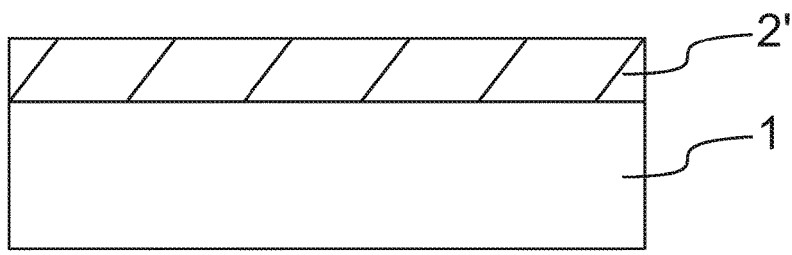
Figure 2C:
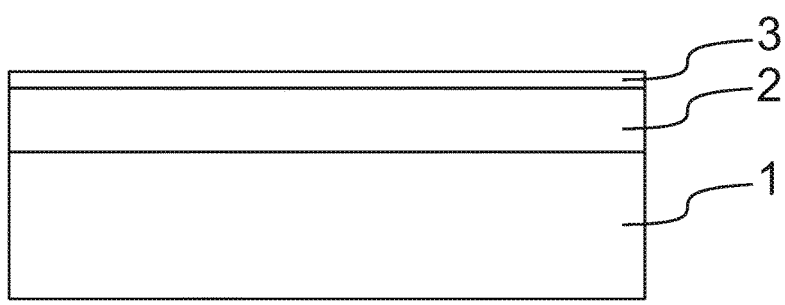

A first aspect of the invention illustrated in FIGS. 1A, 1B and 2A to 2C relates to a method for manufacturing a graphite layer 3 onto an interstitial carbide layer 2. For this, a carbide substrate 1 (FIG. 2A) is first provided. The manufacturing method comprises:
- a step E1 of depositing a metal layer 2' formed by one or more metals onto the carbide substrate 1, the metal layer 2' being able to form an interstitial carbide, said metal layer 2' at least partially covering the carbide substrate 1 (FIG. 2B);
- a heat treatment step E2 during which a temperature higher than the dissociation temperature of the carbide of the substrate 1 is applied (FIG. 2C).

The heat treatment step E2 allows on the one hand the reaction between the metal layer 2' and the substrate 1 to form an interstitial carbide layer 2 as well as a first part of a graphite layer 3 at the surface of said interstitial carbide layer 2; and on the other hand, the formation of a second part of the graphite layer 3 at the surface of the substrate 1 which is not covered with the metal layer 2' when the metal layer 2' does not entirely cover the substrate 1. The layer 3 obtained at the end of the heat treatment step E2 is thus continuous and covers the interstitial carbide layer 2 as well as the part of the substrate 1 which is not covered (when the latter exists) with said interstitial carbide layer 2. By "the layer being able to form an interstitial carbide", it is meant that the material making up the metal layer has a preferential affinity for carbon. In other words, the temperature and pressure conditions upon implementing the method according to the invention are chosen such that the affinity of the material making up the metal layer with carbon is higher than the affinity of said material with the other chemical elements making up the carbide substrate.

In a first embodiment according to a first aspect of the invention, the substrate 1 is a silicon carbide (SiC) substrate and the metal layer 2' is made of niobium (Nb), this metal being able to form an interstitial carbide, namely niobium carbide (NbC). Indeed, niobium has a greater affinity with carbon than with silicon when the temperature is higher than 1 200° C. for a pressure of 106 mbar or higher than 1 300° C. for an inert gas atmosphere (for example argon) at a pressure equal to or close to atmospheric pressure. The deposition can for example be made using a deposition by Joule effect or by sputtering. In any case, the deposition is made under a controlled atmosphere, preferably under vacuum or in an atmosphere comprising one or more gases. For example, it is possible to conduct a deposition by evaporating a niobium film of 40 nm onto the carbide substrate 1, the pressure during the deposition being maintained at $5 \times 10^{-7}$ mbar and the deposition rate being 0.75 nm/s. Other deposition methods or parameters can however be contemplated depending on the deposited materials or even the desired surface quality.

In this first embodiment, the heat treatment step E2 is performed under primary (that is a pressure between $10^5$ and $10^{-3}$ Pa) or secondary (that is a pressure lower than $10^{-3}$ Pa) vacuum. It can comprise a first temperature ramp raising the temperature to 1 140° C. This ramp can for example have a duration of 60 minutes. The heat treatment step E2 can also comprise a second thermal ramp raising the temperature to 1 360° C. This second ramp can for example have a duration of 180 minutes and be followed by a plateau during which the temperature is maintained at 1 360° C., that is above the dissociation temperature of silicon carbide, said plateau having for example a duration of 18 minutes. The temperature plateau is then followed by a ramp lowering the temperature down to ambient temperature. This return to ambient temperature can for example be performed by following the reverse steps, in other words a ramp lowering the temperature to 1 140° C. followed by a second ramp lowering the temperature down to the ambient temperature.

In a second embodiment according to a first aspect of the invention illustrated in FIG. 1B, in order to more precisely control the graphite growth, the heat treatment step E2 is performed under an argon (Ar) atmosphere, the thickness of graphite obtained being then lower than in the absence of argon. Further, this step is preceded by a step E3 of preparing the substrate 1.

This step E3 of preparing the substrate 1 aims at restructuring the surface of the silicon carbide substrate before the heat treatment step E2. This preparing step E3 can comprise a first temperature ramp raising the temperature to 800° C. The duration of this ramp can for example be equal to 60 minutes. At the end of this ramp, a gas mixture comprising preferably 95% argon and 5% hydrogen is introduced in the enclosure until a pressure equal to the atmospheric pressure is established. A constant flow of the same gas mixture is maintained throughout the step E3 of preparing the substrate 1. The step E3 of preparing the substrate 1 can also comprise a temperature ramp raising the temperature to 1 600° C., the duration of this ramp being for example 90 minutes. This ramp is then followed by a temperature plateau the duration of which is for example equal to 30 minutes. The temperature plateau is followed by a temperature ramp lowering the temperature to 800° C., this ramp having for example a duration of 90 minutes. This enables the surface of silicon carbide of the substrate 1 to be restructured in the form of large even terraces and the number of nucleation points to be reduced in order to promote the growth of a single graphene layer.

At the end of this step E3 of preparing the substrate 1, the heat treatment step E2 is implemented. The latter first comprises a sub-step of replacing the gas mixture with pure argon by means of a pure argon flow. Once the mixture is fully flushed from the enclosure in which the heat treatment step E3 is performed and replaced with argon, the argon flow is stopped and a static argon atmosphere is maintained throughout the heat treatment step E2. A temperature ramp is then performed, the latter raising the temperature to 1 600° C. for example and having for example a duration equal to 200 minutes. This ramp is followed by a temperature plateau, said plateau having for example a duration of 30 minutes. At the end of this plateau, a temperature ramp is implemented during which the temperature is lowered to ambient temperature, this ramp having a duration of 260 minutes for example.

Both previous embodiments are only an illustration of a method according to a first aspect of the invention. In both these embodiments, the metal used is niobium. Of course, this is only an illustrating example and any metal or metal alloy likely to form an interstitial carbide can be used.

At the end of the method according to a first or a second embodiment of a first aspect of the invention, the stack obtained comprises the substrate 1 of silicon carbide, the niobium carbide layer 2 and the graphite layer 3 (FIG. 2C).

The number of graphene sheets making up the graphite layer 3 is a function of the duration of the heat treatment step E2 as well as the temperature reached during this treatment step E2 and the possible argon pressure during this heat treatment step E2. Thus, the graphite layer 3 can comprise one or more graphene sheets. It is further important to note that the interface between the interstitial carbide layer 2 and the graphite layer 3 has a low resistance. In other words, it is possible to use such a stack in order to make an electrical contact with the graphite layer 3 obtained at the end of the heat treatment step E2.

Figure 3:
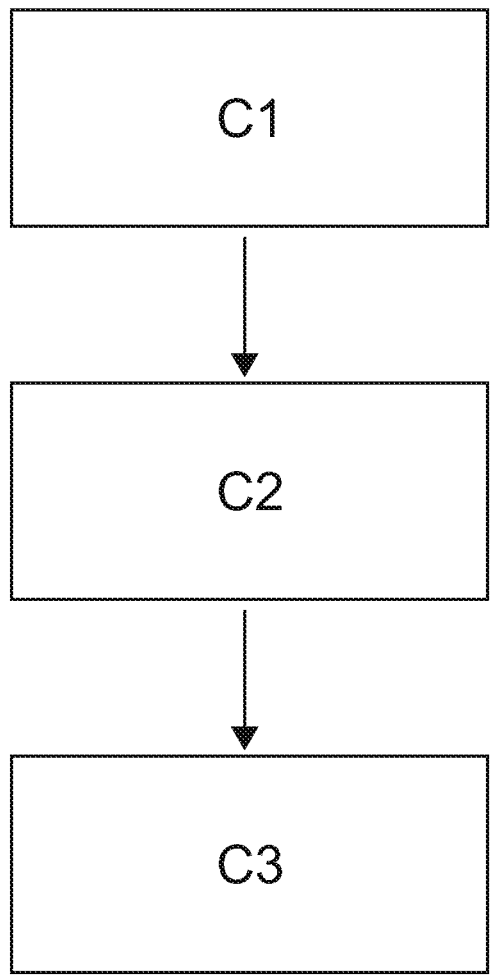
FIG. 3 shows a flowchart of a first embodiment of a method according to a second aspect of the invention.
Figure 4A:
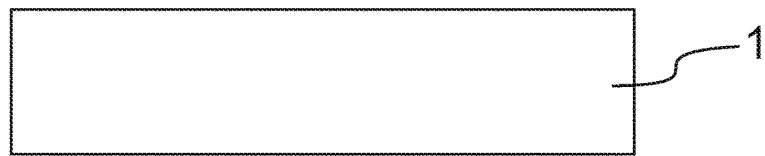
FIGS. 4A to 4D illustrate the different steps of a first embodiment of a method according to a second aspect of the invention.
Figure 4B:
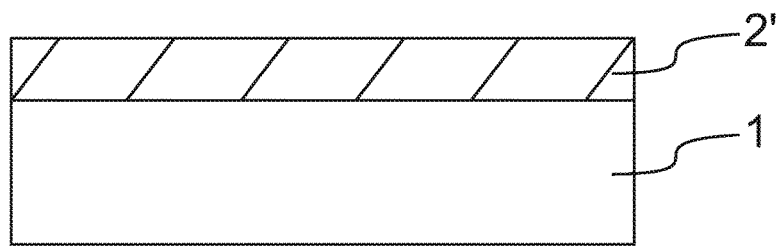
Figure 4C:
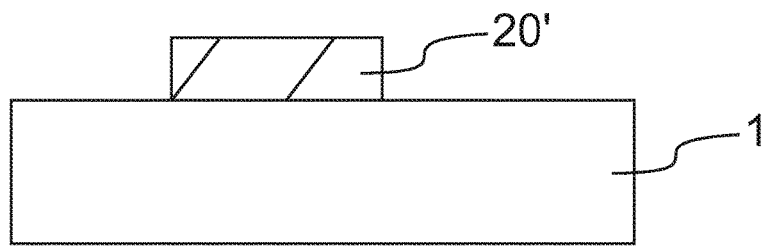
Figure 4D:
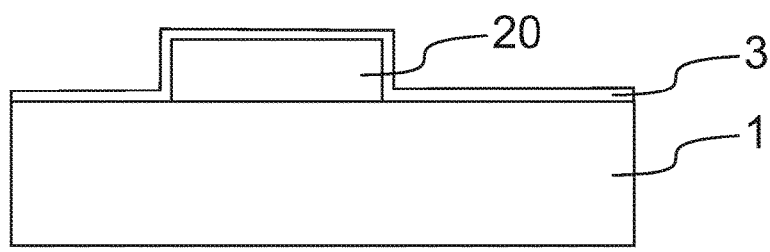
Figure 5:
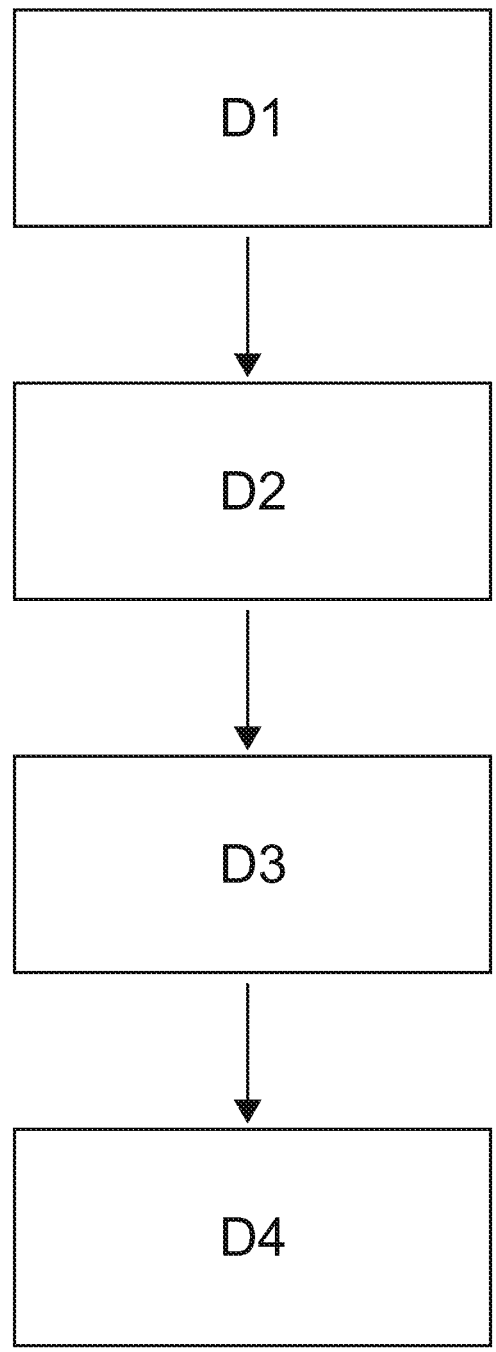
FIG. 5 shows a flowchart of a first embodiment of a method according to a third aspect of the invention.

For this, a second aspect of the invention illustrated in FIG. 3 and in FIGS. 4A to 4D relates to a method for making an electrical contact 20 on a graphite layer 3 deposited onto a carbide substrate 1. The method comprises:
- a step C1 of depositing a metal layer 2' formed by one or more metals onto the carbide substrate 1, the metal layer 2' being able to form an interstitial carbide, said metal layer 2' at least partially covering the carbide substrate 1 (FIG. 4B);
- a step C2 of structuring said metal layer 2', said structuring defining a metal contact 20' (FIG. 4C);
- a heat treatment step C3 during which the temperature is higher than the dissociation temperature of the carbide of the substrate (FIG. 4D).

During the heat treatment step C3, the metal contact 20' reacts with the substrate 1 to form an interstitial carbide contact 20 as well as a first part of a graphite layer 3 at the surface of said contact 20. Moreover, a second part of the graphite layer 3 is formed at the surface of the substrate 1 which is not covered with the contact 20. The graphite layer 3 obtained at the end of the heat treatment step C3 is thus continuous and covers the interstitial carbide contact 20 as well as the part of the substrate 1 which is not covered with said interstitial carbide contact 20 (FIG. 4D).

In a first embodiment according to a second aspect of the invention, the metal layer 2' is made of tantalum (Ta), this metal being able to form an interstitial carbide, that is tantalum carbide (TaC). The step C2 of structuring said metal layer 2' thus enables a tantalum metal contact 20' to be obtained. It is obvious that if here a single contact is discussed, it is possible to make several contacts as will be described in what follows.

In this embodiment, the heat treatment step C3 enables the tantalum metal contact 20' to be converted into a tantalum carbide contact 20 (FIG. 4D). As previously discussed, the resistance at the interface between the tantalum carbide contact 20 and the graphite layer 3 is low. The Tantalum carbide contact 20 thus makes an electrical contact with the graphite layer 3 otherwise deposited onto the carbide substrate 1. The method thus enables an electrical contact 20 to be made on a graphite layer 3 deposited on a carbide substrate 1. In this first embodiment, the heat treatment step C3 is for example identical to the heat treatment step E2 described within the scope of the first embodiment according to a first aspect of the invention, that is performed under a primary or secondary vacuum.

However, in a second embodiment according to a second aspect of the invention, the heat treatment step C3 can be identical to the heat treatment step E2 described within the scope of the second embodiment according to a first aspect of the invention, that is, under an argon atmosphere. In this case, this heat treatment step C3 will be preferably immediately preceded by a step of preparing the substrate 1 as set out in the second embodiment according to a first aspect of the invention, that is under an atmosphere of a hydrogen and argon gas mixture.

Figure 6A:
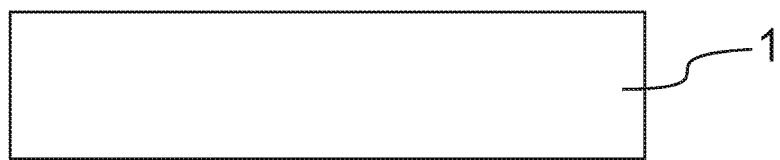
FIGS. 6A to 6F illustrate the different steps of a first embodiment of a method according to a third aspect of the invention.
Figure 6B:
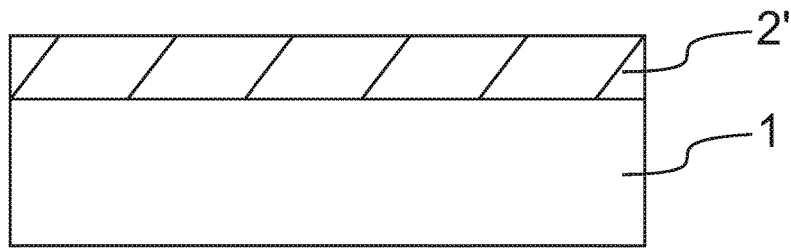
Figure 6C:
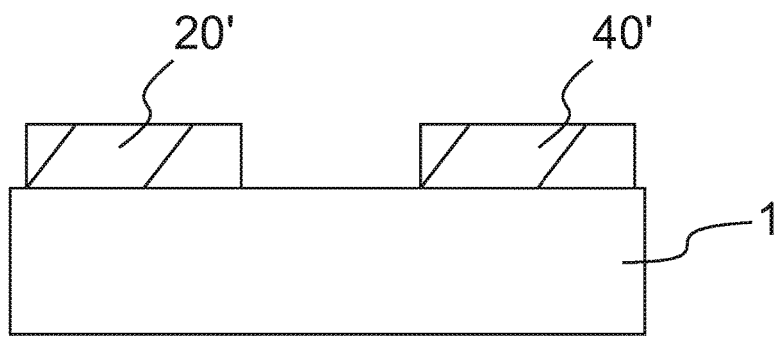
Figure 6D:
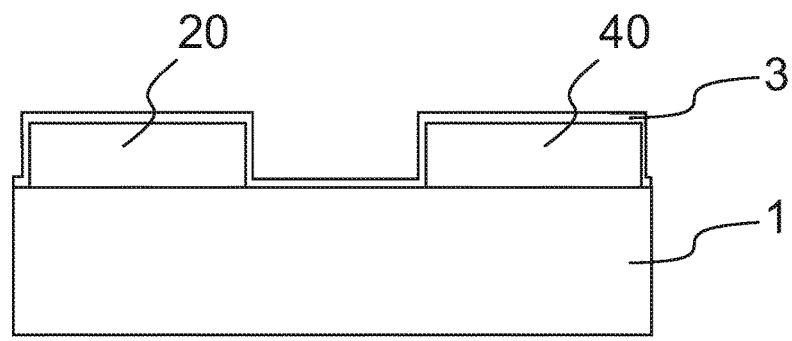

Then, it is possible to use such contacts in order to manufacture a graphite based device. For this, a third aspect of the invention illustrated in FIGS. 5 and 6A to 6F relates to a method for making a graphite based electronic device. To that end, a carbide substrate 1 is first provided (FIG. 6A). The method comprises:
- a step D1 of depositing a metal layer 2' formed by one or more metals onto a carbide substrate 1, the metal layer 2' being able to form an interstitial carbide, said metal layer 2' at least partially covering the carbide substrate 1 (FIG. 6B).
- a first step D2 of structuring said metal layer 2', said structuring defining a first metal contact 20' and a second metal contact 40' (FIG. 6C).
- a heat treatment step D3 during which a temperature higher than the dissociation temperature of the carbide of the substrate 1 is applied (FIGS. 6D and 6E).

During this heat treatment step D3, the first 20' and second 40' metal contacts react with the carbide substrate 1 to form a first 20 and a second 40 interstitial carbide contacts as well as a first part of a graphite layer 3 at the surface of said contacts 20, 40. Further, during the same step, a second part of the graphite layer 3 is formed at the surface of the substrate 1 which is not covered with the first and second contacts 20, 40.

Figure 6E:
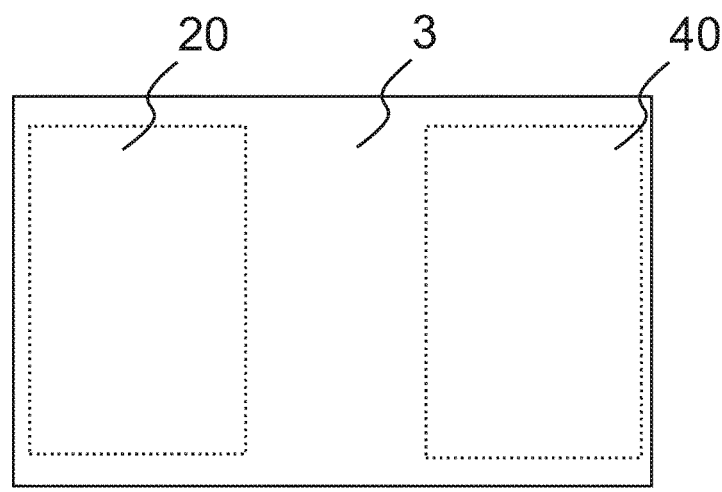

As illustrated in FIG. 6E, the graphite layer 3 obtained at the end of the heat treatment step D3 is thus continuous and covers the first contact 20, the second interstitial carbide contact 40 as well as the part of the substrate 1 which is not covered with said interstitial carbide contacts 20, 40. In other words, the graphite layer 3 covers all of the substrate 1 and of both contacts 20, 40. But, such a configuration does not make up an electronic device as such.

In order to obtain an electronic device, the method thus comprises a second step D4 of structuring the graphite layer 3 present at the surface of the first contact 20, of the second contact 40 and of the exposed part of the surface of the carbide substrate 1 which enables an active part connecting the first contact to the second contact (FIG. 6F) to be defined.

Figure 6F:
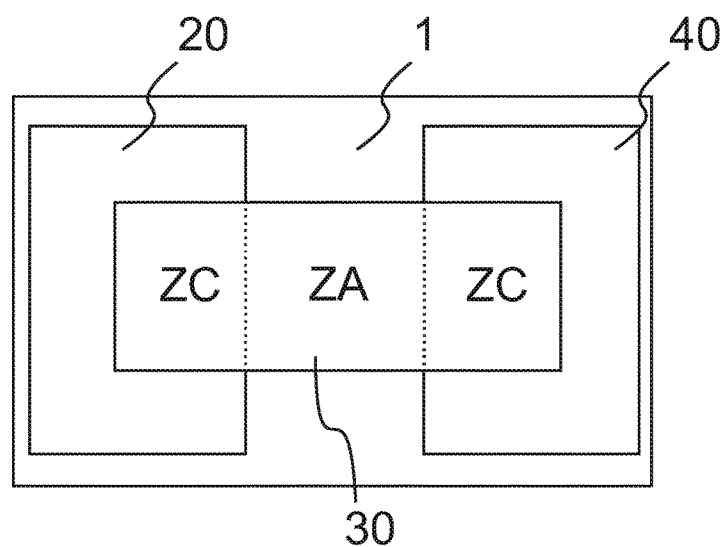

As illustrated in FIG. 6F, at the end of the method according to a third aspect of the invention, a device is obtained comprising a first contact 20 (or first electrode) and a second contact 40 (or second electrode). Both these electrodes are electrically connected with a graphite tape 30 through two contact zones ZC. Both these contact zones ZC are separated by an active zone ZA consisting of the central part of the graphite tape 30. The method thus enables a graphite based electronic device to be made on a carbide substrate 1.

In a first embodiment according to a third aspect of the invention, the metal layer 2' is made for example of niobium (Nb), this metal being able to form an interstitial carbide, that is niobium carbide (NbC). The step D2 of structuring said metal layer 2' thereby enables a first niobium metal contact and a second niobium metal contact to be obtained.

In this embodiment, the step D3 of heat treatment enables the first metal contact 20' and the second niobium metal contact 40' to be converted into a first contact 20 and a second contact 40 of niobium carbide. As previously discussed, the resistance at the interface between said niobium carbide contacts 20, 40 and the graphite layer 3 is low. In this first embodiment, this heat treatment step D3 is for example identical to the heat treatment step E2 described within the scope of the first embodiment according to a first aspect of the invention, that is performed under a primary or secondary vacuum.

However, it is also possible to contemplate a second embodiment in which the heat treatment step D3 is identical to the heat treatment step E2 described within the scope of the second embodiment according to a first aspect of the invention, that is under an argon atmosphere. In this case, this heat treatment step D3 will be preferably immediately preceded by a step of preparing the substrate as set out in the second embodiment according to a first aspect, that is under an atmosphere of a hydrogen and argon gas mixture.

In both embodiments according to a third aspect of the invention just set out, the metal layer 2' is made of niobium, this layer forming, after the first structuring step D2 and the heat treatment step D3, two niobium carbide contacts 20, 40. But, it is known that niobium carbide, at a low temperature (lower than 12 K), is a supraconducting material. In other words, the method just described enables a so-called hybrid device implementing a supraconducting material at the first contact 20 and the second contact 40 as well as a conductive material at the graphite tape 30 to be obtained, said graphite tape 30 being in turn obtained at the end of the second structuring step C4. Such a hybrid device could in particular be employed within the scope of quantum engineering and making supraconducting quantum circuits for quantum optics and metrology.

However, as previously discussed, niobium is not the only material that can be used within the scope of the invention. Indeed, any material enabling an interstitial carbide to be formed can be employed. For example, it is possible to use a metal layer 2' comprising iron (Fe), this element being able to form a carbide called cementite. But, cementite is a ferromagnetic material the Curie temperature of which is equal to about 200° C.: this material is thus ferromagnetic at ambient temperature. It is thus possible to manufacture, using the method according to a third aspect of the invention, a hybrid device involving a ferromagnetic material at the first contact 20 and the second contact 40 as well as a conductive material at the graphite tape 30. Such a hybrid device could in particular be employed in manufacturing spintronic components, that is components using, in addition to the charge, the electronic spin as an information medium.

The invention claimed is:

1. A method for manufacturing a graphite layer on an interstitial carbide layer, the method comprising:
   depositing a metal layer formed by one or more metals on a carbide substrate, the metal layer being able to form an interstitial carbide, said metal layer at least partially covering the carbide substrate;
   performing a heat treatment during which a temperature higher than the dissociation temperature of the carbide of the carbide substrate is applied;
   wherein the heat treatment allows a reaction between the metal layer and the carbide substrate to form the interstitial carbide layer as well as a first part of the graphite layer at a surface of said interstitial carbide layer; and, when the metal layer only partially covers the carbide substrate, a formation of a second part of the graphite layer at surface of the carbide substrate which is not covered with the metal layer.

2. The method according to claim 1, wherein the graphite layer is comprised of a graphene sheet.

3. The method according to claim 1, wherein the substrate is a silicon carbide substrate or an aluminium carbide substrate.

4. The method according to claim 1, wherein the one or more metals forming the metal layer are chosen from Titanium (Ti), Zirconium (Zr), Hafnium (Hf), Vanadium (V), Niobium (Nb), Tantalum (Ta), Chromium (Cr), Molybdenum (Mo), Tungsten (W) or alloys thereof.

5. A method for making an electrical contact on a graphite layer deposited onto a carbide substrate, the method comprising:
   depositing a metal layer formed by one or more metals onto the carbide substrate, the metal layer being able to form an interstitial carbide, said metal layer at least partially covering the carbide substrate;
   structuring said metal layer, said structuring defining a metal contact;
   performing a heat treatment during which a temperature higher than the dissociation temperature of the carbide of the carbide substrate is applied;
   wherein the heat treatment allows a reaction between the metal contact and the carbide substrate to form an interstitial carbide contact as well as a first part of a graphite layer at a surface of said interstitial carbide contact; and a formation of a second part of the graphite layer at a surface of the carbide substrate which is not covered with the interstitial carbide contact.

6. The method according to claim 5, wherein the carbide of the carbide substrate is a less conductive carbide, at an operating temperature of the contact, than the graphite of the graphite layer.

7. An electrical contact capable of being obtained by the method for making an electrical contact according to claim 5.

8. A method for making a graphite based electronic device, the method comprising:
   depositing a metal layer formed by one or more metals onto a carbide substrate, the metal layer being able to form an interstitial carbide, said metal layer at least partially covering the carbide substrate;
   structuring said metal layer, said structuring defining a first metal contact and a second metal contact;
   performing a heat treatment step during which a temperature higher than a dissociation temperature of the carbide of the carbide substrate is applied and:
      the first and second metal contacts react with the carbide substrate to form a first and a second interstitial carbide contacts as well as a first part of a graphite layer at a surface of said first and second interstitial carbide contacts;
      a second part of the graphite layer is formed at a surface of the carbide substrate which is not covered by the first and second interstitial carbide contacts; and
   structuring the graphite layer present at the surface of the first interstitial carbide contact, the second interstitial carbide contact and the non-covered part of the carbide substrate defining an active part connecting the first interstitial carbide contact to the second interstitial carbide contact.

9. An electronic device capable of being obtained by the method for making a graphite based electronic device according to claim 8.

* * * * *